(12) United States Patent
Chen et al.

(10) Patent No.: US 6,511,870 B2
(45) Date of Patent: Jan. 28, 2003

(54) SELF-ALIGNED LDD POLY-SI THIN-FILM TRANSISTOR

(75) Inventors: Chih-Chiang Chen, YiLan (TW); Jiun-Jye Chang, KaoShiung (TW); Ching-Sang Chuang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/850,058

(22) Filed: May 8, 2001

(65) Prior Publication Data

US 2002/0168808 A1 Nov. 14, 2002

(51) Int. Cl.[7] .......................... H01L 21/00; H01L 21/84
(52) U.S. Cl. ........................................ 438/163; 438/303
(58) Field of Search ................... 438/163, 303, 438/305

(56) References Cited

U.S. PATENT DOCUMENTS 5,476,802 A * 12/1995 Yamazaki et al. ............ 437/21
5,620,905 A * 4/1997 Konuma et al. ............ 438/163
5,994,192 A * 11/1999 Chen ........................... 438/303

* cited by examiner

Primary Examiner—Richard Elms
Assistant Examiner—Michael K. Luhrs
(74) Attorney, Agent, or Firm—Troxell Law Office PLLC

(57) ABSTRACT

A method of fabricating a polysilicon thin film transistor with a self-aligned lightly doped drain (LDD) is described. At first a polysilicon-island region and a gate insulating layer are subsequently formed on a glass substrate performed by a pre-treatment. Then a metal layer and a cap layer are subsequently formed on the gate insulating layer. The cap layer and the metal layer are defined to form a gate. A heavily doped region is formed in the polysilicon island region with serving the gate as a mask. An activation step is performed on the heavily doped region and a sidewall of the metal layer. The cap layer above the metal layer and the sidewall of the metal layer performed by the activation step are removed. A lightly doped region is formed in the polysilicon-island region with serving the remaining metal layer.

19 Claims, 5 Drawing Sheets

SELF-ALIGNED LDD POLY-SI THIN-FILM TRANSISTOR

BACKGROUND OF THE INVENTION

1. Field of Invention

The present invention relates to a method of fabricating a thin film transistor (TFT). More particularly, the present invention relates to a method of fabricating a polysilicon (poly-Si) TFT with a self-aligned lightly doped drain (LDD), which can form a thinner LDD without adding any photo mask steps.

2. Description of Related Art

Currently in all panel display technologies the liquid crystal display (LCD) technology grows fastest. According the application and the selling of LCD which grows double every year, it plays an important role among display devices. Particularly, the color and the quality of a thin film transistor (TFT) are sufficient to be a competitor of cathode-ray tube.

Today different technological processes of fabricating the TFT are developed. A conventional TFT process includes depositing each layer in turn on a glass substrate. Please refer to FIGS. 1A–1E showing schematic, cross-sectional views of a conventional TFT process. The steps of fabricating a conventional TFT process are as followed.

(a) A glass substrate 10 is provided. A pre-treatment is performed on the glass substrate 10. The pre-treatment includes subsequently depositing a buffer layer and an active layer (not shown), and performing an annealing process on the active layer. The material of the active layer is α-Si. A polysilicon region is defined by photolithography and etching.

(b) A gate insulating layer 20 and a metal layer 25 are subsequently deposited on the glass substrate performed by the pre-treatment.

(c) A gate is defined with a photo resist layer by photolithography and etching.

(c) A gate is defined with a photo resist layer by photolithography and etching.

(d) A light ion doping (N⁻) step is performed with serving the gate as a mask to form a lightly doped region 15a in the polysilicon region 15. The dopant can be phosphorus ions or arsenous ions.

(e) A photo resist 40 is defined by a photo process.

(f) A heavy ion doping (N⁺) step is performed with serving the gate as a mask to form a heavily doped region 15b in the polysilicon region 15. The dopant can be phosphorus ions or arsenous ions.

Thus a thin film transistor (TTT) with the heavily doped region 15b and the lightly doped region 15a is formed.

However, it needs two steps of forming a photo mask to form the foresaid conventional TFT process. This causes difficulties in processing, misaligned issue, and an increase of resistance. The increasing resistance leads to poor conductivity of a source line, further influencing the reliability and the performance of products of the TFT. Therefore, it is a need to improve the fabricating method for the TFT.

SUMMARY OF THE INVENTION

One object of the present invention is to provide a method of fabricating a polysilicon (poly-Si) TFT with a self-aligned lightly doped drain (LDD), which can form a thinner LDD without adding any photo mask steps. The processes are thus simplified.

Another object of the present invention is to provide a method of fabricating a polysilicon (poly-Si) TFT with a self-aligned lightly doped drain (LDD), which uses a step of oxidizing a metal gate to form a heavily doped region and a lightly doped region. Thus misalignment can be avoided and the process of forming the lightly doped region becomes more precise.

Another object of the present invention is to provide a method of fabricating a polysilicon (poly-Si) TFT with a self-aligned lightly doped drain (LDD), which can simultaneously activate the heavily doped region and is also suitable for a low temperature polysilicon process.

According to the fabricating method of the present invention, at first a polysilicon-island region and a gate insulating layer are subsequently formed on a glass substrate performed by a pre-treatment. Then a metal layer and a cap layer are subsequently formed on the gate insulating layer. The cap layer and the metal layer are defined to form a gate. A heavily doped region is formed in the polysilicon island region with serving the gate as a mask. An activation step is performed on the heavily doped region and a sidewall of the metal layer. The cap layer above the metal layer and the sidewall of the metal layer performed by the activation step are removed. A lightly doped region is formed in the polysilicon-island region with serving the remaining metal layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The present invention is to provide a method of fabricating a polysilicon (poly-Si) thin film transistor (TFT) with a self-aligned lightly doped drain (LDD). The invention can decrease the resistance of a gate and data bus-line. Moreover, the invention can form a thinner LDD without adding any step of forming a photo mask. Therefore, the invention is simple and has a precise self-aligned process. Furthermore, a heavily doped region is simultaneously activated. Thus the invention is suitable for low temperature polysilicon (LTPS) process.

Figure 1A:
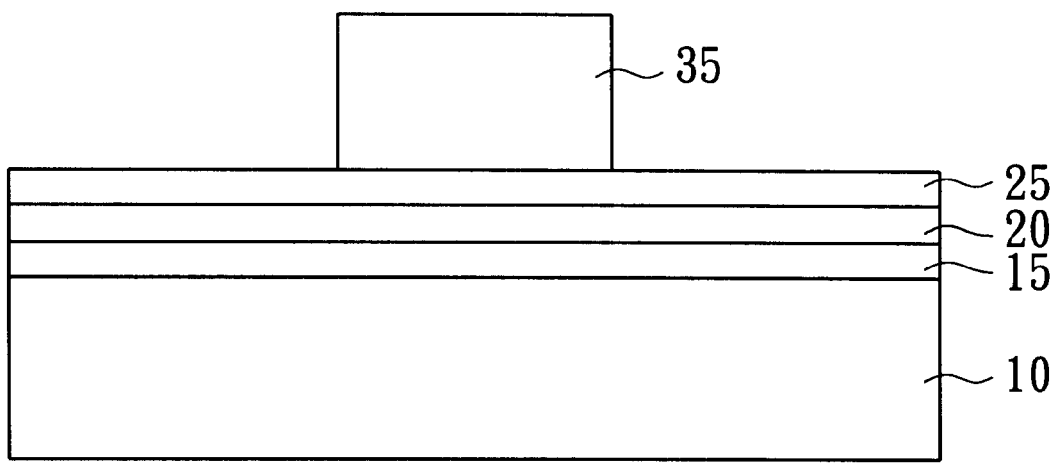
FIGS. 1A–1E show schematic, cross-sectional views of a conventional thin film transistor process.
Figure 1B:
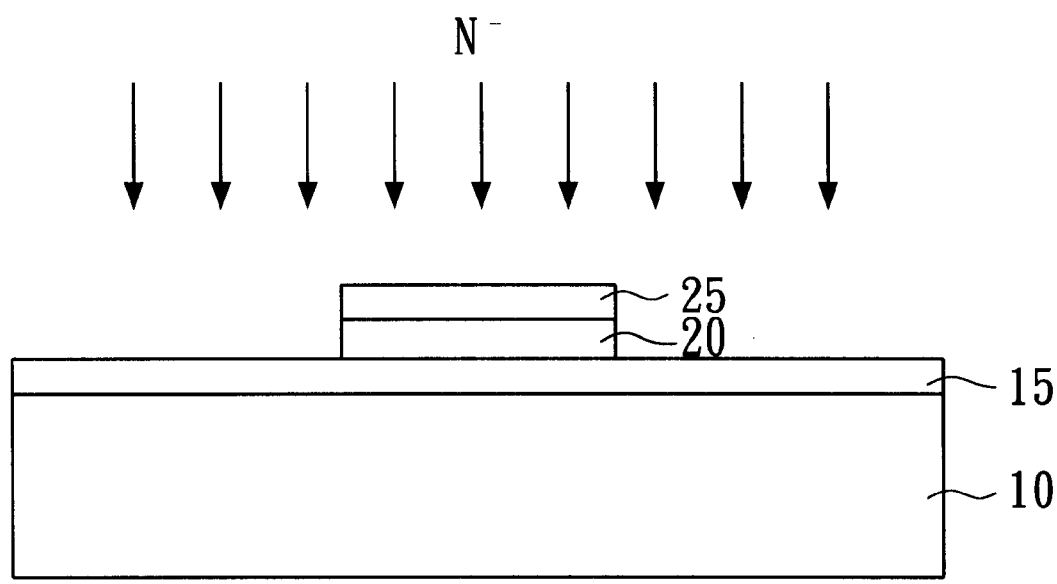
Figure 1C:
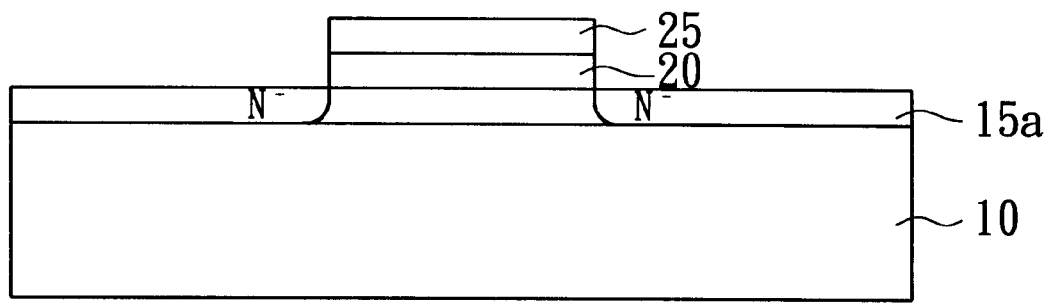
Figure 1D:
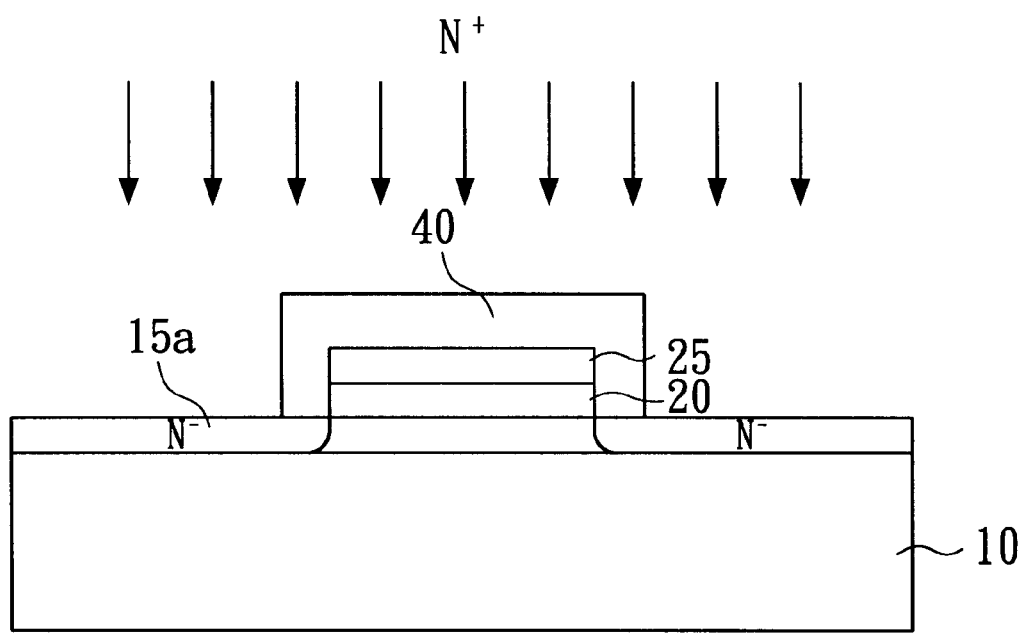
Figure 1E:
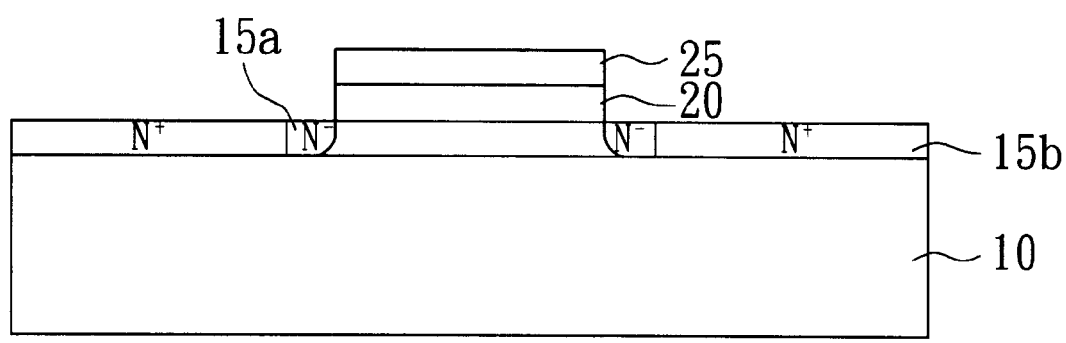
Figure 2A:
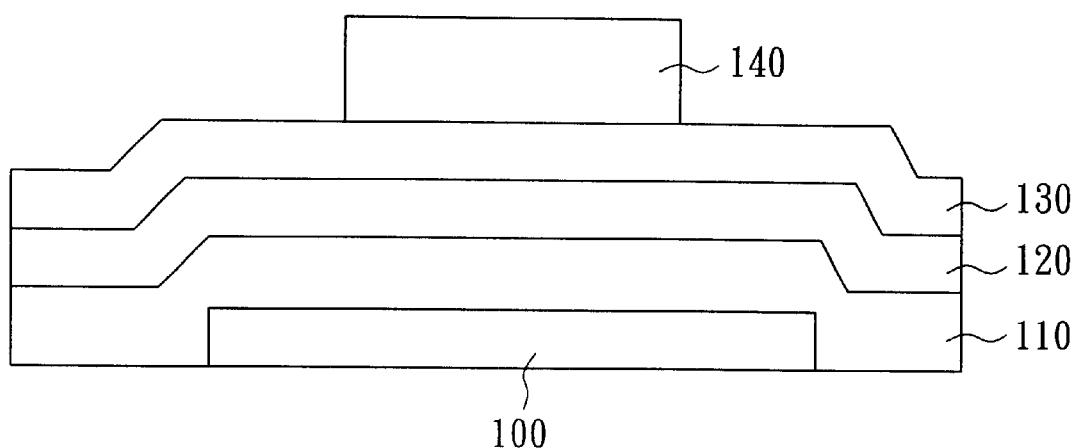
FIGS. 2A–2D show schematic, cross-sectional views of fabricating a thin film transistor with a self-aligned lightly doped drain. According to one preferred embodiment of the present invention.

Please refer to FIGS. 2A–2D showing schematic, cross-sectional views of fabricating a thin film transistor with a self-aligned lightly doped drain. Referring to FIG. 2A, a glass substrate (not shown) is provided. A pre-treatment is performed on the glass substrate. The pre-treatment includes subsequently depositing a buffer layer and an active layer (not shown) on the glass substrate. The buffer layer can be a tetraethyl-orthosilicate (TEOS) layer which is approximately 2500 Angstroms to 3500 Angstroms thick. The active layer can be a α-Si layer which is approximately 250 Angstroms to 750 Angstroms thick, preferably 500 Angstroms. A polysilicon-island region 100 is defined by, for example, photolithography and etching. Since these processes are well-known by people skilled in the art, the clear description about the processes are omitted herein.

Referring to FIG. 2A, a gate insulating layer 110, a metal layer 120 and a cap layer 130 are subsequently formed on the polysilicon-island region 100 performed by the pretreatment. The material of the gate insulating layer 110 can be tetraethyl-orthosilicate (TEOS). The gate insulating layer 110 is approximately 500 Angstroms to 1500 Angstroms thick, preferably 1000 Angstroms thick. The material of the metal layer 120 is selected from one of the group of MoW, Cr, Al, Al/Nd, Mo, Ti, Ta and Cu. The material of the metal layer 120 is preferably MoW and is approximately 500 Angstroms to 3500 Angstroms thick. The material of the cap layer 130 includes tetraethyl-orthosilicate (TEOS) or silicon nitride (SiN). The cap layer 130 is approximately 500 Angstroms to 1500 Angstroms thick.

Figure 2B:
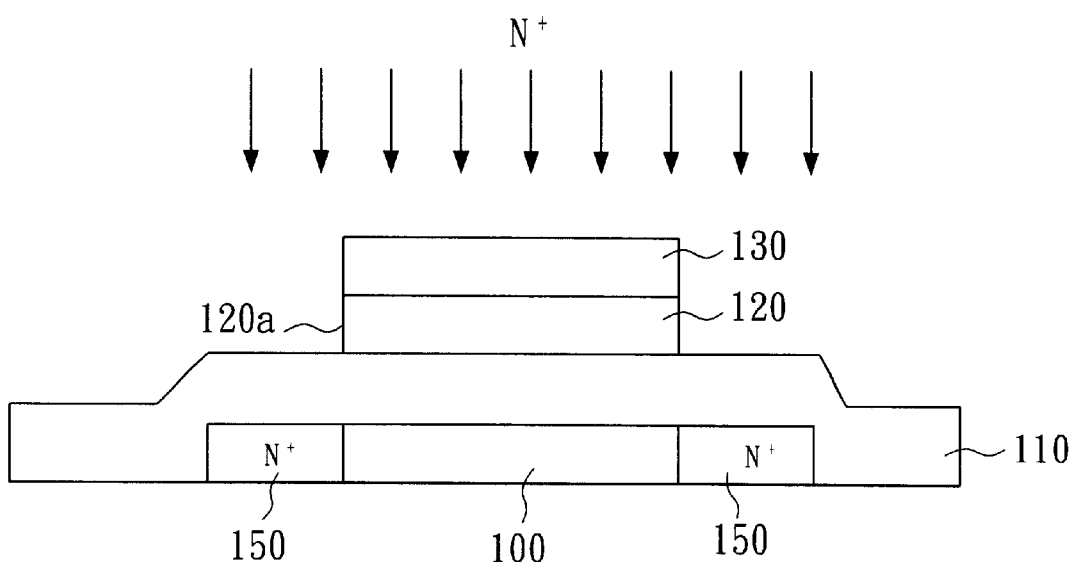

Referring to FIG. 2B, a gate is defined by, for example, photolithography and etching, with serving a photo resist 140 as a mask. A heavy ion doping ($N^+$) step is performed with serving the gate as a mask to form a heavily doped region 150 in the polysilicon-island region 100. The dopants of the heavy ion doping step can be phosphorus ions or arsenous ions with high concentration.

Figure 2C:
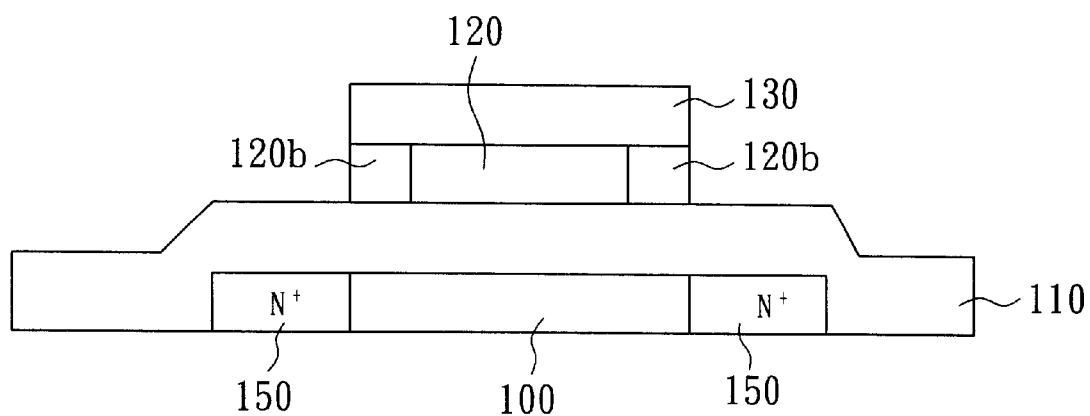

Referring to FIG. 2C, an activation step is performed on the heavily doped region 150 and the sidewall 120a of the metal layer 120. The activation step includes a laser activating rapid temperature annealing (RTA) step or a high temperature activation step. The high temperature activation step is performed in an ambience with, for example, atmosphere (AT), oxygen or water vapor. The temperature of the high temperature activation step depends on the composition of the metal layer 120. The temperature of the high temperature activation step is commonly higher than 350° C., preferably approximately 350° C.–800° C., and most preferably 450° C. The duration of the high temperature activation step is preferably approximately 0.5 hours to 3 hours. After the high temperature activation step is performed the sidewall 120a of the metal layer 120 is oxidized to form metal oxide 120b. Since the cap layer 130 is formed on the metal layer 120, the sidewall 120a of the metal layer 120 is totally surrounded by metal oxide 120b.

Figure 2D:
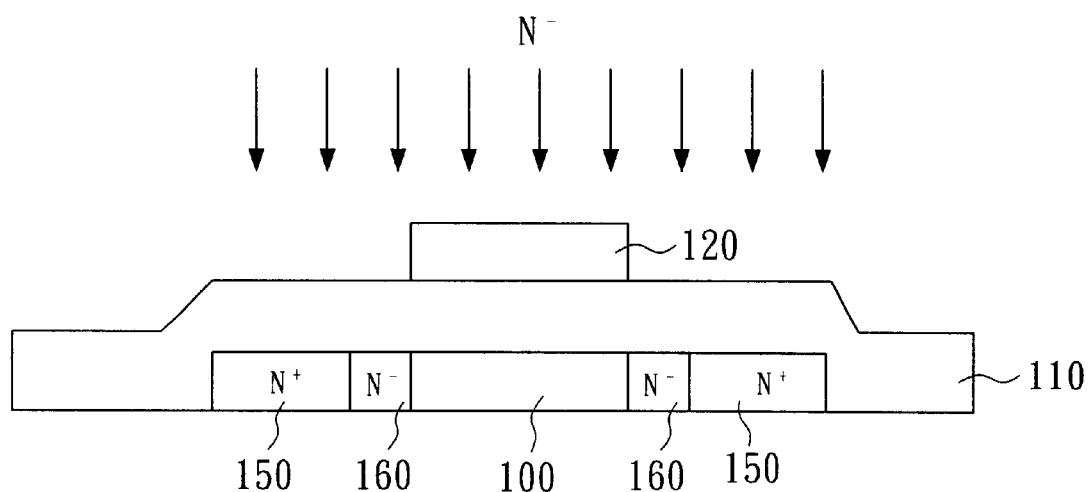

Referring to FIG. 2D, the cap layer 130 of oxide above the metal layer 120 and the metal oxide 120b of the metal layer 120 performed by the activation step are removed by, for example, wet etching, plasma dry etching or buffered oxide etching (BOE). With serving the remaining metal layer 120 as a mask, a light ion ($N^-$) doping step is performed to form a lightly doped region 160 in the polysilicon-island region 100. The dopants of the light ion doping step can be phosphorus ions or arsenous ions with low concentration. Since the metal oxide 120b of the metal layer 120 is removed, the width of the lightly doped region 160 is approximately equal to the width of the removed metal oxide 120b of the metal layer 120. Thus the thinner lightly doped region 160 can be formed. Then a series of thin film transistor (TFT) process such as performing a re-activation step, and forming an inner layer, a second metal layer and a passivation layer are performed. Since these processes are well-known by people skilled in the art, the clear description about the processes are omitted herein.

Accordingly, because the invention uses a metal gate of MoW, the gate and the data bus-line have low resistance. The invention forms a thinner LDD without adding any step of forming a photo mask. The processes are thus simplified. Moreover, since the heavily doped region and the lightly doped region are formed using oxidizing the metal gate, misalignment can be avoided and the process of forming the lightly doped region is more precise. Furthermore, the heavily doped region can be simultaneously activated. The invention is suitable for the low temperature polysilicon process so that problems due to the conventional method can be solved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a polysilicon thin film transistor (TFT) with a self-aligned lightly doped drain, comprising the steps of:

(a) forming a polysilicon-island region and a gate insulating layer on a glass substrate performed by a pretreatment;

(b) forming a metal layer and a cap layer on the gate insulating layer;

(c) defining the cap layer and the metal layer to form a gate;

(d) forming a heavily doped region in the polysilicon island region using the gate as a mask;

(e) performing an activation step on the heavily doped region and a sidewall of the metal layer thereby forming metal oxide on the sidewall of the metal layer;

(f) removing the cap layer above the metal layer and the metal oxide from the sidewall of the metal layer by the activation step; and (g) forming a lightly doped region in the polysilicon-island region with the remaining metal layer as a mask.

2. The method according to claim 1, wherein the pretreatment comprises forming a buffer layer and an active layer on the glass substrate.

3. The method according to claim 2, wherein the buffer layer is a tetraethyl-orthosilicate (TEOS) oxide layer which is between 2500 Angstroms and 3500 Angstroms thick.

4. The method according to claim 2, wherein the active layer is a α-Si layer which is between 250 Angstroms and 750 Angstroms thick.

5. The method according to claim 1, wherein the cap layer is between 500 Angstroms and 1500 Angstroms thick.

6. The method according to claim 5, wherein the material of the cap layer is selected from the group consisting of tetraethyl-orthosilicate (TEOS) and silicon nitride (SiN).

7. The method according to claim 1, wherein the material of the cap layer is selected from the group consisting of tetraethyl-orthosilicate (TEOS) and silicon nitride (SiN).

8. The method according to claim 1, wherein the gate insulating layer is a tetraethyl-orthosilicate (TEOS) layer between 500 Angstroms and 1500 Angstroms thick.

9. The method according to claim 1, wherein the metal layer is selected from the group consisting of MoW, Cr, Al, Al/Nd, Mo, Ti, Ta and Cu.

10. The method according to claim 9, wherein the metal layer is between 500 Angstroms and 3500 Angstroms thick.

11. The method according to claim 1, wherein the metal layer is between 500 Angstroms and 3500 Angstroms thick.

12. The method according to claim 1, wherein the activation step comprises laser activating rapid temperature annealing (RTA).

13. The method according to claim 1, wherein the activation step comprises a high temperature activation step.

14. The method according to claim 11, wherein the high temperature activation step is performed in an ambience with atmosphere (AT), oxygen or water vapor.

15. The method according to claim 13, wherein the high temperature activation step is performed between 350° C.–800° C.

16. The method according to claim 13, wherein duration of the high temperature activation step is between 0.5 hours and 3 hours.

17. The method according to claim 1, wherein the removing step (f) is performed by wet etching.

18. The method according to claim 1, wherein the removing step (f) is performed by plasma dry etching.

19. The method according to claim 1, wherein the removing step (f) is performed by buffered oxide etching (BOE).

* * * * *